(12) United States Patent
Astigarraga et al.

(10) Patent No.: US 8,108,180 B2
(45) Date of Patent: *Jan. 31, 2012

(54) END OF LIFE PREDICTION OF FLASH MEMORY

(75) Inventors: Tara Astigarraga, Tucson, AZ (US); William E. Atherton, Hillsborough, NC (US); Michael E. Browne, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 363 days.

This patent is subject to a terminal disclaimer.

(21) Appl. No.: 12/041,320

(22) Filed: Mar. 3, 2008

(65) Prior Publication Data

US 2008/0162079 A1  Jul. 3, 2008

Related U.S. Application Data

(63) Continuation of application No. 11/539,027, filed on Oct. 5, 2006, now Pat. No. 7,356,442.

(51) Int. Cl.
*G06F 12/00* (2006.01)
(52) U.S. Cl. ....................................................... 702/182
(58) Field of Classification Search ................... 702/182
See application file for complete search history.

(56) References Cited

U.S. PATENT DOCUMENTS

| 5,568,439 | A | 10/1996 | Harari |
| 6,249,838 | B1 | 6/2001 | Kon |
| 2004/0218440 | A1 | 11/2004 | Kumar et al. |
| 2005/0041453 | A1 | 2/2005 | Brazis et al. |
| 2005/0044454 | A1 | 2/2005 | Moyshayedi |
| 2005/0108491 | A1 | 5/2005 | Wong et al. |
| 2005/0286336 | A1 | 12/2005 | Harari et al. |
| 2007/0260811 | A1* | 11/2007 | Merry et al. .................. 711/103 |

* cited by examiner

*Primary Examiner* — Tung S Lau
(74) *Attorney, Agent, or Firm* — Jose Gutman; Fleit Gibbons Gutman Bongini & Bianco PL

(57) ABSTRACT

Disclosed are a method, electronic device, and computer readable medium for determining an end-of-life stage of the flash memory. The method includes detecting at least one life cycle event associated with a flash memory residing on an electronic device. A counter that is associated with the life cycle event is then incremented. Based on the counter, a total number of occurrences for the one life cycle event is determined. The total number of occurrences for the at least one given threshold is also determined. A current life cycle stage of the flash memory is identified based at least in part on determining if the total number of occurrences exceeds at least one given threshold. The life cycle stage is associated with the at least one given threshold. A user is then notified of the life cycle state of the flash memory.

15 Claims, 5 Drawing Sheets

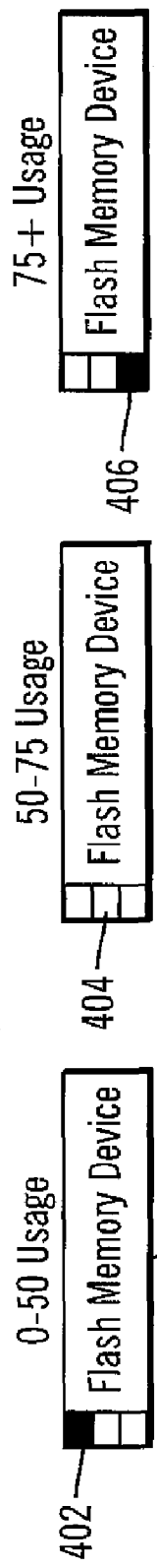
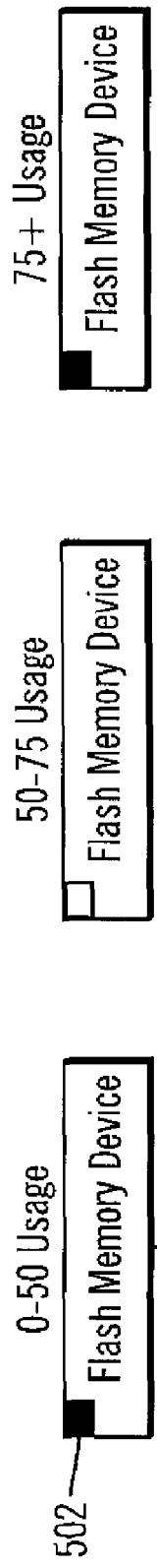

END OF LIFE PREDICTION OF FLASH MEMORY

CROSS REFERENCE TO RELATED APPLICATIONS

This is a continuation of application Ser. No. 11/539,027, filed Oct. 5, 2006, now U.S. Pa. No. 7,356,442. The entire disclosure of prior application Ser. No. 11/539,027 is herein incorporated by reference.

FIELD OF THE INVENTION

The present invention generally relates to the field of memory devices, and more particularly relates to end of life prediction for flash memory.

BACKGROUND OF THE INVENTION

Flash memory provides non-volatile memory where blocks (which include multiple locations) of flash memory are erasable in a flash operation. Flash memory comprises cells, which are an array of floating gate transistors, for storing information. Traditionally one bit of information can be stored in each cell. However, some flash memory devices such as multi-cell memory devices can store more than one bit per cell. Two well-known types of circuitry that are present in flash memory cells are NAND and NOR.

Flash memory is currently limited by the fact that it has a finite number of erase-write cycles. Current flash memory does not have a way to notify a user of its erase-write cycle life is being approached or has been exceeded. In other words, users are not able to predict when their flash memory devices are about to fail. When a flash memory device fails, the device is inoperable and any data stored on the device is lost or corrupted. Without being informed of a possible device failure, a user may continue to store critical information on the flash memory, which will be lost when the flash memory device fails.

Therefore a need exists to overcome the problems with the prior art as discussed above.

SUMMARY OF THE INVENTION

Briefly, in accordance with the present invention, disclosed are a method, electronic device, and computer readable medium for determining an end-of-life stage of the flash memory. The method comprises detecting at least one life cycle event associated with a flash memory residing on an electronic device. A counter that is associated with the life cycle event is then incremented. Based on the counter, a total number of occurrences for the one life cycle event is determined. The total number of occurrences for the at least one given threshold are also determined. The total number of occurrences for the at least one life cycle event are stored on the flash memory. The method also includes determining whether the total number of occurrences exceeds at least one given threshold. A current life cycle stage of the flash memory is identified based at least in part on the determining if the total number of occurrences exceeds at least one given threshold. The life cycle stage is associated with the at least one given threshold. A user is then notified of the life cycle state of the flash memory.

In another embodiment, a method with a first electronic device communicatively coupled to at least a second electronic device including at least one flash memory, for determining an end-of-life stage of the flash memory is disclosed. The method comprise detecting, by the first electronic device at least one life cycle event associated with a flash memory residing on the at least second electronic device. The first electronic device is communicatively to the at least second electronic device. A counter associated with the life cycle event is then incremented. Based on the counter, a total number of occurrences for the one life cycle event is determined. The total number of occurrences for the at least one life cycle event is stored on the flash memory. The method also includes determining whether the total number of occurrences exceeds at least one given threshold. A current life cycle stage of the flash memory is identified based at least in part on the determining if the total wherein The life cycle stage is associated with the at least one given threshold. A user is then notified of the life cycle state of the flash memory.

In yet another embodiment, an electronic device comprising at one flash memory module is disclosed. The electronic device includes at least one flash memory module and a life cycle event counter communicatively coupled to the at least one flash memory. The life cycle counter detects at least one life cycle event associated with the at least one flash memory module. The life cycle counter increments a life cycle count for the at least one life cycle event. The life cycle count is stored on the at least one flash memory module. The electronic device also includes a life cycle stage estimator that is communicatively coupled to the life cycle counter and the at least one flash memory module. The life cycle stage estimator determines a total number of occurrences for the at least one life cycle event.

The life cycle stage estimator also determines if the total number of occurrences exceeds at least one given threshold. The life cycle stage estimator identifies a current life cycle stage of the flash memory based at least in part on the determining if the total number of occurrences exceeds at least one given threshold. The life cycle stage is associated with the at least one given threshold. At least one notification module is also included in the electronic device. The at least one notification module notifies a user of the life cycle state of the flash memory module.

In another embodiment, a computer readable medium for determining an end-of-life stage of the flash memory is disclosed. The computer readable medium comprises instructions for detecting at least one life cycle event associated with a flash memory residing on an electronic device. A counter that is associated with the life cycle event is then incremented. Based on the counter, a total number of occurrences for the one life cycle event is determined. The total number of occurrences for the at least one given threshold are also determined. The total number of occurrences for the at least one life cycle event are stored on the flash memory. The method also includes determining whether the total number of occurrences exceeds at least one given threshold. A current life cycle stage of the flash memory is identified based at least in part on the determining if the total number of occurrences exceeds at least one given threshold. The life cycle stage is associated with the at least one given threshold. A user is then notified of the life cycle state of the flash memory.

In a further embodiment, a computer readable medium on a first electronic device communicatively coupled to at least a second electronic device including at least one flash memory, for determining an end-of-life stage of the flash memory is disclosed. The computer readable medium comprising instructions for determining an end-of-life stage of the flash memory is disclosed. The method comprise detecting, by the first electronic device at least one life cycle event associated with a flash memory residing on the at least second electronic device. The first electronic device is communicatively to the at least second electronic device. A counter associated with the life cycle event is then incremented. Based on the counter, a total number of occurrences for the one life cycle event is determined. The total number of occurrences for the at least one life cycle event is stored on the flash memory. The method also includes determining whether the total number of occurrences exceeds at least one given threshold. A current life cycle stage of the flash memory is identified based at least in part on the determining if the total wherein The life cycle stage is associated with the at least one given threshold. A user is then notified of the life cycle state of the flash memory.

One advantage of the present invention is that a user is notified when a flash memory device is reaching its end-of-life cycle. The device itself can include a notification means such as LED lights, an audible notification, and the like so that a user can be notified by the device when it is reaching its end-of-life cycle. Additionally, the end-of-life cycle of a flash memory can be monitored by another device such as a computer system housing the flash memory. Physical hardware and/or software on the external device can monitor the flash memory so that a user can be notified when the flash memory's end-of-life cycle is approaching or has been exceeded. Accordingly, a user can transfer critical data off of the flash memory prior to the memory failing.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 4 and FIG. 5 are block diagrams illustrating a flash memory device indicating to a user its current end-of-life state according to an embodiment of the present invention.

DETAILED DESCRIPTION

The present invention as would be known to one of ordinary skill in the art could be produced in hardware or software, or in a combination of hardware and software. However in one embodiment the invention is implemented in software. The system, or method, according to the inventive principles as disclosed in connection with the preferred embodiment, may be produced in a single computer system having separate elements or means for performing the individual functions or steps described or claimed or one or more elements or means combining the performance of any of the functions or steps disclosed or claimed, or may be arranged in a distributed computer system, interconnected by any suitable means as would be known by one of ordinary skill in the art.

According to the inventive principles as disclosed in connection with the preferred embodiment, the invention and the inventive principles are not limited to any particular kind of computer system but may be used with any general purpose computer, as would be known to one of ordinary skill in the art, arranged to perform the functions described and the method steps described. The operations of such a computer, as described above, may be according to a computer program contained on a medium for use in the operation or control of the computer, as would be known to one of ordinary skill in the art. The computer medium, which may be used to hold or contain the computer program product, may be a fixture of the computer such as an embedded memory or may be on a transportable medium such as a disk, as would be known to one of ordinary skill in the art.

The invention is not limited to any particular computer program or logic or language, or instruction but may be practiced with any such suitable program, logic or language, or instructions as would be known to one of ordinary skill in the art. Without limiting the principles of the disclosed invention any such computing system can include, inter alia, at least a computer readable medium allowing a computer to read data, instructions, messages or message packets, and other computer readable information from the computer readable medium. The computer readable medium may include non-volatile memory, such as ROM, Flash memory, floppy disk, Disk drive memory, CD-ROM, and other permanent storage. Additionally, a computer readable medium may include, for example, volatile storage such as RAM, buffers, cache memory, and network circuits. Furthermore, the computer readable medium may include computer readable information in a transitory state medium such as a network link and/or a network interface, including a wired network or a wireless network that allows a computer to read such computer readable information.

Exemplary Flash Memory Device

Figure 1:
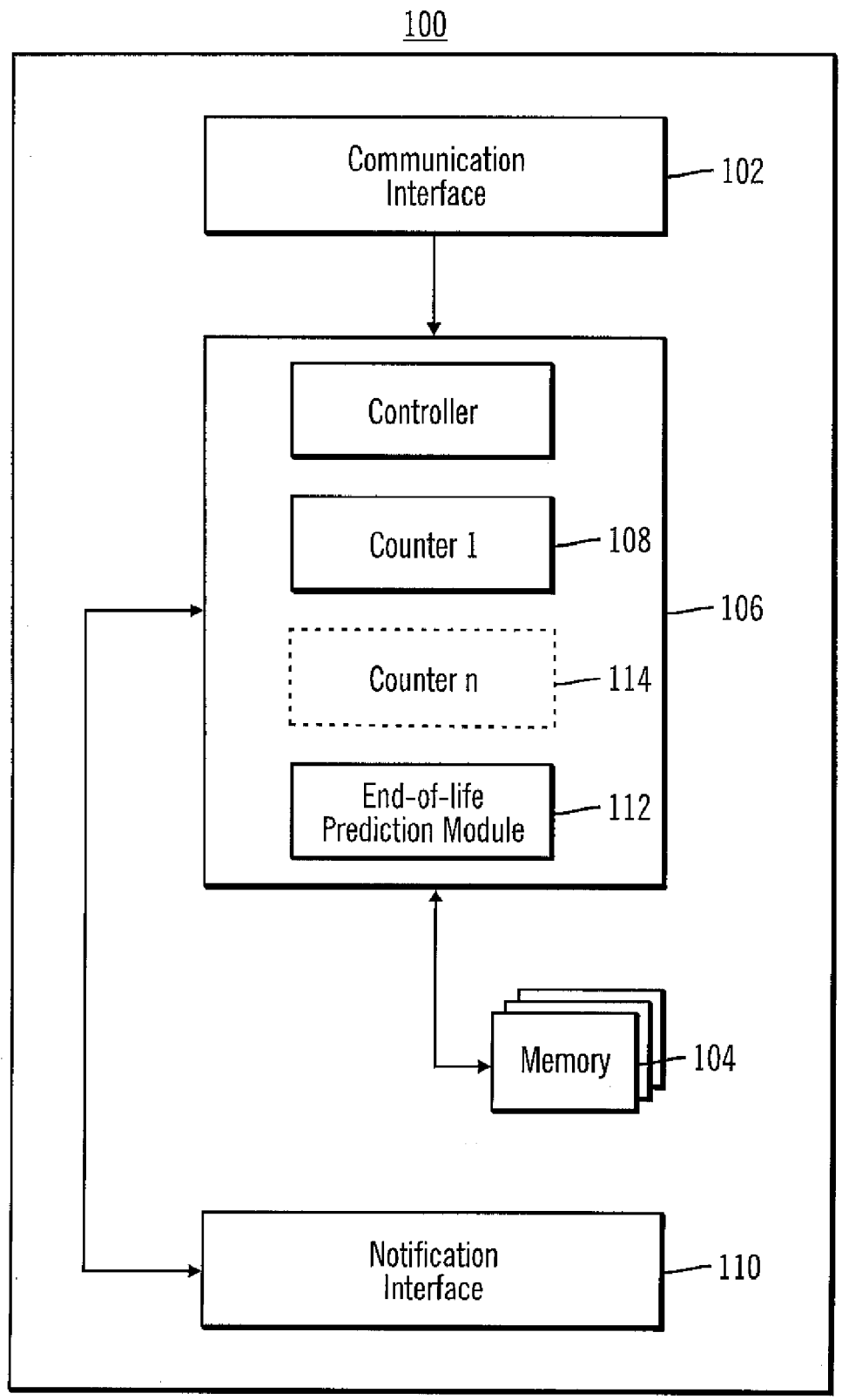
FIG. 1 is a block diagram illustrating an exemplary flash memory according to an embodiment of the present invention.

FIG. 1 is a block diagram of an exemplary flash memory device 100 according to an embodiment of the present invention. In one embodiment of the present invention, the flash memory device 100 is an external device such as a Universal Serial Bus ("USB") flash device. However, it should be noted that the present invention is not limited to external flash memory devices or flash memory devices utilizing a USB communication interface. For example, the present invention is also applicable to internal flash memory found in many devices such as wireless communication devices, service processors, desktop computers, notebook computers, and the like.

In one embodiment, the flash memory device 100 includes a communication interface 102 such as a USB interface. The communication interface 102 allows the flash memory device 100 to communication with another device such as a desktop or notebook computer. The flash memory device 100 also includes an array of non-volatile flash memory cells 104. In one embodiment, the memory cells are arranged in a plurality of addressable banks. The data stored in the memory 104 can be accessed using externally provided addresses. A controller 106 is also included in the flash memory device 100 for controlling read/write cycles of the flash memory device, user notifications (via the notification interface 110), and the like. The notification interface 110 can include one or more light emitting diodes ("LED") or their equivalent, a speaker for audible alerts, and the like. The notification interface 110 can notify the user of a power on/off cycle, read/write cycle, and/or end-of-life status of the flash memory device 100.

In one embodiment, the controller 106 includes one or more counters 108, which monitor the read/write cycles, power cycles, and the like of the flash memory device 110. In one embodiment, a single counter 108 can be used to monitor relevant activities or an individual counter can be used to monitor each of read cycles, write cycles, power cycles, and the like. The activities can be monitored in real time (i.e. as they happen) or the number of occurred activities can be counted each time the flash memory device 100 is "plugged in" to an external device such as an information processing system. In one embodiment, the counter 108 stores the event count (number of writes, reads, power cycles, errors, and the like) on in the flash memory cells 104.

The controller 108 can also include additional optional counters 114. In one embodiment, one or more counters 114 or not integrated with the flash memory device 100. For example, when the flash memory device 100 is communicatively coupled (e.g., plugged into) an external device such as an information processing system, the operating system of the information processing system saves the non-integrated counter 114 to its hard drive or other storage medium. Therefore the counter 114 is portable and the information processing system can read the counter from its storage medium. It should be noted that the non-integrated counter 114 can reside outside of the controller. An end-of-life prediction module 112 uses the information monitored by the counter(s) 108 to determine a status of the flash memory device 100 with respect to its end-of-life period. An end-of-life period is the point of complete failure by the flash memory device when its limit of read/write cycles has occurred.

The controller 106, in one embodiment, can also analyze the counter(s) 108 for detecting counter malfunctions and/or defective counters. For example, the controller 106 analyzes the counter(s) 108 to identify the counter(s) 108 has decreasing counts or numbers going past a set threshold. In response to detecting a malfunctioning counter 108 or a defective counter 108, the controller 108 can change the life cycle stage for notifying a user of the detected problem.

In one embodiment, the end-of-life prediction module 112 includes various weighting logic to assign weights to each of the activities monitored by the one or more counters 108. For example, writes to memory cells 104 or more intensive than reads to memory cells 104, thereby consuming more of the memory device's lifespan. Therefore, in one embodiment, each of the monitored activities can have a different weight assigned to them. The end-of-life prediction module 112, in one embodiment, uses these weights, the number of instances monitored for each activity, and the known end-of-life time period to determine the current life cycle stage of the flash memory device 100.

In one embodiment, the end-of-life prediction module 112 estimates when the flash memory device 100 is going to fail based on the components detected within the device. In another embodiment, a manufacturer can pre-program the number of read/write cycles, power on cycles, errors that can occur before the device fails. The counter(s) 108, in one embodiment, can count the number of errors present in each memory cell 104. The end-of-life prediction module 112 can then use the number of errors detected as a further indicator of the flash memory device's 100 current life cycle stage.

In this example, the counter 108 can be incremented by a heavy weighting factor (e.g. giving more weight to an erroneous count) that can be increased as the number of errors increases. This can be based on intrinsic failure information of the flash memory device 100 given by the manufacturer, usage experience in testing or customer installations, and the like. One advantage of detecting errors is the ability to have an early detection of possible failure by the flash memory device 100. It should be noted that, in one embodiment, the end-of-life prediction module 112 can reside within the counter(s) 108.

Once the end-of-life prediction module 112 determines the life cycle stage of the flash memory device 100, it can display the life cycle status to the user. For example, the notification interface 110 can display a visual notification such as a blinking light, colored lights, or a combination thereof to indicate a particular state in the life cycle of the flash memory device 100. Alternatively, an audible notification such as a beep or a combination of beeps can also be used (or in conjunction with a visual notification) to indicate to a user the life cycle stage of the flash memory device 100. The life cycle stage notification process is discussed in greater detail below.

In one embodiment, the counter(s) 108 and/or the end-of-life prediction module 112 are accessible via one or more addresses by an external processing interface such as an information processing machine. The external device can perform further validation of the life cycle stage of the flash memory device 100 and/or inform the user the life cycle stage of the flash memory device 100. When an external processing interface is used the counter 108 can be read once or at various intervals. Historical information associated with the device such as read/write cycles, power-on cycles, ad the like can then be recorded. In this example, the information processing device can provide usage statistics, or more advanced analysis on when a failure might occur. The information processing device can then communicate with other components to start a service process for replacing the flash memory.

In this example, an electronic service call can be generated and a service technician can be dispatched to follow a service procedure to replace that particular part. An example of this system is a System p Model p595 commercially available from the International Business Machines Corporation (IBM) of White Plains, N.Y., United States of America. In this example the hardware management console ("HMC") can read the counters (108) from redundant service processors that utilize flash memory as their storage mechanism. The counters 108 are read to determine if the service processor which includes the flash memory needs to be replaced. Once the HMC determines if the flash memory needs to be replaced it can generate a service event with IBM service focal point that orders the part, notifies the customer, and places a service call to have the part replaced.

Exemplary Information Processing System

Figure 2:
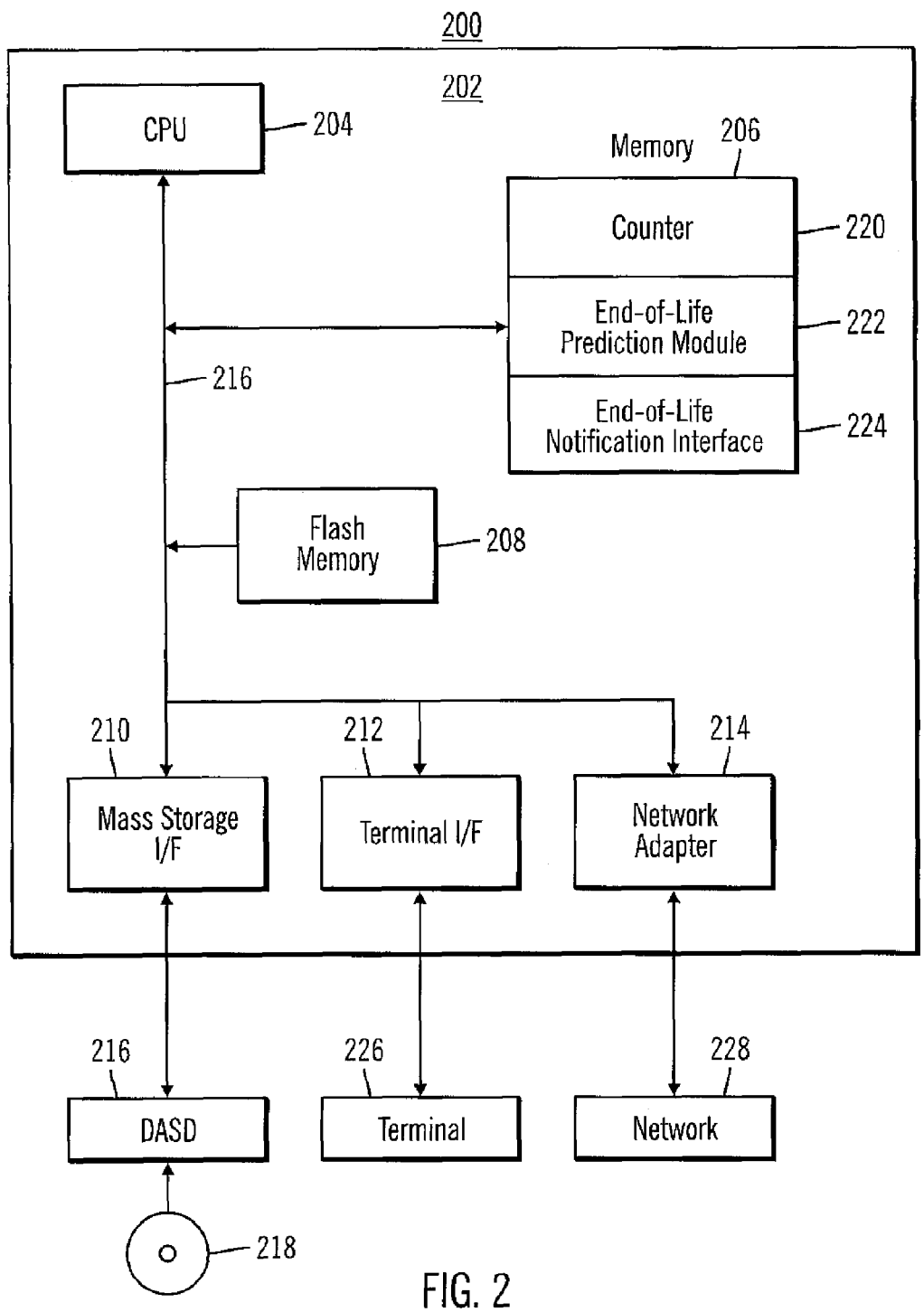
FIG. 2 is block diagram illustrating an exemplary information processing system according to an embodiment of the present invention.

FIG. 2 is a block diagram illustrating a detailed view of an information processing system 200. The information processing system 200 is based upon a suitably configured processing system adapted to implement the exemplary embodiment of the present invention. Any suitably configured processing system is similarly able to be used as the information processing system 200 by embodiments of the present invention, for example, a personal computer, workstation, wireless communication device, gaming counsel, hand-held gaming device, or the like.

The information processing system 200 includes a computer 202. The computer 202 has a processor 204 that is connected to the main memory 206, flash memory 208, mass storage interface 210, terminal interface 212, and a network adapter hardware 214 via a system bus 216. The mass storage interface 210 is used to connect mass storage devices such as data storage device 216 to the information processing system 200. One specific type of data storage device is a computer readable medium such as a CD drive, which may be used to store data to and read data from a CD 218 or its equivalent.

Another type of data storage device is a data storage device configured to support, for example, NTFS type file system operations.

The main memory 206, in one embodiment, can be volatile memory such as Random Access Memory ("RAM") includes, among other things, a counter 220, an end-of-life prediction module 222, and an end-of-life cycle notification interface 224. It should be noted that one or more of these components can reside within the flash memory 208 instead of the main memory 206. The counter 220, similar to the counter 108 discussed above in FIG. 1, monitors the read/write cycles, power cycles, and the like of the flash memory 208. In one embodiment, a single counter 220 monitors the relevant activities or individual counters can be used to monitor each of the read cycles, the write cycles, the power cycles, errors and the like.

The counter 220 can be monitor and count these activities in real time or can be counted at various given time intervals such as the startup of the information processing system 200. The end-of-life prediction module 222, similar to the end-of-life prediction module 112, uses the counted information to determine the current life cycle stage of the flash memory 208. The counter 220, in one embodiment, can also be the non-integrated counter 114 discussed above. In other words the counter 220 can be retrieved from the flash memory device 100 and stored in memory 206. Also, more than one counter 220 can be included in the information processing system 200.

The end-of-life prediction module 112, or the counter 220 itself, can assign weights to each of the monitored/counted activities as discussed above. The end-of-life prediction module 222, in one embodiment, uses these weights, the number of instances monitored/counted for each activity, and the known end-of-life time period to determine the current life cycle stage of the flash memory device 100. It should be noted that weights do not have to be assigned to the monitored/counted activities.

As discussed above, the end-of-life prediction module 222 can estimate a given end-of-life period of the flash memory 208 based on the components detected within the flash memory 208. In another embodiment, a manufacture can pre-program the number of read/write cycles, power on cycles, errors that can occur before the flash memory 308 fails. The number of errors in the flash memory 208, as discussed above, can also be counted by the counter 220 for use as a further indicator of the flash memory's current life cycle stage.

Once the end-of-life prediction module 222 determines the life cycle stage of the flash memory 208, the user can be notified. For example, the end-of-life notification interface 224 can use a visual and/or an audible notification to inform the user of the flash memory's 208 current life cycle stage. For example, if the counter 220 and end-of-life prediction module 222 are implemented as software, a corresponding software program can visually and/or audibly notify a user of the current life cycle stage of the flash memory 208. A visual notification can be a pop-up message on a display, a new window being displayed to a user, a blinking widget, a newly displayed widget, an email, and the like.

Figure 3:
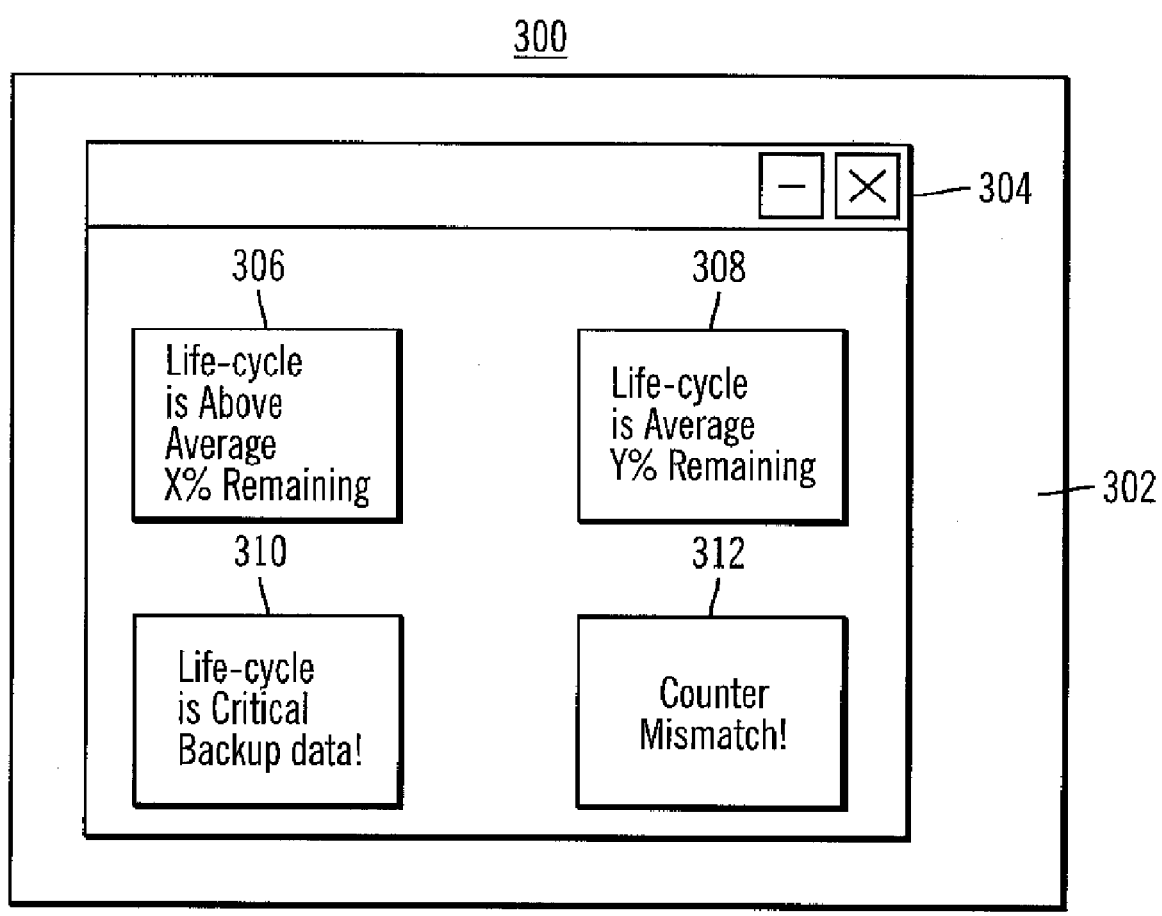
FIG. 3 is a block diagram illustrating one example of notifying a user of a current life cycle stage for a flash memory according to an embodiment of the present invention.

For example, FIG. 3 shows a display 300 comprising a user interface 302 and a window 304. The window 304 includes various messages that can be displayed to a user regarding the life cycle stage of the flash memory 208. For example, a first message 306 indicates that the life-cycle of the flash memory 208 is above average and has a certain percentage remaining. A second message 308 indicates that the life-cycle of the flash memory 208 is average and has a certain percentage remaining. A third message 310 indicates that the life cycle is critical and memory failure is going to occur soon. A fourth message 312 indicates that a counter mismatch has occurred. For example, if the counter 220 on the information processing system 200 is greater than the counter on the flash memory device 100, the user is notified.

It should be noted that the present invention is not limited to any one way of visually notifying the user of the current life cycle stage of the flash memory 208. It should also be noted that these methods for visually notifying a user can also be implemented in the embodiment where a flash memory device 100 is connected to the information processing system 200, which determines the life-cycle stage of the flash memory device 100.

Although illustrated as concurrently resident in the main memory 206 it is clear that respective components of the main memory 306 are not required to be completely resident in the main memory 206 at all times or even at the same time. In one embodiment, the information processing system 200 utilizes conventional virtual addressing mechanisms to allow programs to behave as if they have access to a large, single storage entity, referred to herein as a computer system memory, instead of access to multiple, smaller storage entities such as the main memory 206 and data storage device 216. Note that the term "computer system memory" is used herein to generically refer to the entire virtual memory of the information processing system 200.

Although only one CPU 204 is illustrated for computer 202 computer systems with multiple CPUs can be used equally effectively. Embodiments of the present invention further incorporate interfaces that each includes separate, fully programmed microprocessors that are used to off-load processing from the CPU 204. Terminal interface 212 is used to directly connect one or more terminals 226 to computer 202 to provide a user interface to the computer 202. These terminals 226, which are able to be non-intelligent or fully programmable workstations, are used to allow system administrators and users to communicate with the information processing system 200. The terminal 212 is also able to consist of user interface and peripheral devices that are connected to computer 202 and controlled by terminal interface hardware included in the terminal I/F 212 that includes video adapters and interfaces for keyboards, pointing devices, and the like.

An operating system (not shown) included in the main memory 206 is a suitable multitasking operating system such as the Linux, UNIX, Windows XP, and Windows Server 2003 operating system. Embodiments of the present invention are able to use any other suitable operating system. Some embodiments of the present invention utilize architectures, such as an object oriented framework mechanism, that allows instructions of the components of operating system (not shown) to be executed on any processor located within the information processing system 200. The network adapter hardware 214 is used to provide an interface to a network such as a wireless network, WLAN, LAN, or the like (not shown). Embodiments of the present invention are able to be adapted to work with any data communications connections including present day analog and/or digital techniques or via a future networking mechanism.

Although the exemplary embodiments of the present invention are described in the context of a fully functional computer system, those skilled in the art will appreciate that embodiments are capable of being distributed as a program product via a CD/DVD, e.g. CD 218, or other form of recordable media, or via any type of electronic transmission mechanism.

Example of Visually Notifying a User of a Current Life-Cycle Stage

FIG. 4 and FIG. 5 are block diagrams illustrating one example of visually notifying a user of a current life cycle stage of the flash memory device 100 of FIG. 1. The known end-of-life cycle for the exemplary flash memory device 100 is assumed to be 100 for the examples of FIG. 4 and FIG. 5. As discussed above, the actual end-of-life cycle can be determined based on the components in the flash memory device 100 or by a number pre-programmed in by the manufacturer.

In one embodiment, based on the number of read/write cycles, power cycles, errors, and the like, the end-of-life prediction module 112 or the counter 108 sends a signal to the notification interface 110. In this example, the LED lights 402, 404, 406 already existing on the flash memory device 100 are used to indicate the current life cycle of the flash memory device 100. For example, if between 0 and 50 life cycles (which can include any one of or an aggregation of read/write cycles, power cycles, errors, and the like) have occurred, a specific LED(s) or pattern of LEDs can be turned on. For example, FIG. 4 shows that a first LED 402 is displayed.

If between 50 and 75 life cycles have occurred, a second set of LED(s) or pattern of LEDs can be displayed. FIG. 4 shows that no LEDs are displayed to indicate that the current life cycle is at an intermediate state of between 50 and 75 life cycles. FIG. 4 also shows a third example for indicating to a user that the flash memory device 100 is at a critical life cycle stage. For example, FIG. 4 shows that a third LED 406 is displayed for notifying the user that at least 75 out of the 100 available life cycles of the flash memory device 100 have occurred. If a device only has a single LED available, as shown in FIG. 5, the single LED 502 can be steadily displayed (constantly lit), not displayed, intermittently blinking, steadily blinking, blinking in various patterns, and the like. For example, an indication of between 0 and 50 life cycles having occurred can result in the LED 502 being constantly displayed. An indication of between 50 and 75 life cycles having occurred can result in the LED not being displayed. An indication of at least 75 life cycles occurring can result in the LED 502 blinking rapidly.

It should be noted that the examples in FIG. 4 and FIG. 5 are illustrative and not limiting. Any combination or LEDs, colors, blinking patterns may be used to indicate a current life cycle state of the flash memory device 100. Also, as discussed above, an audile notification can also be used in place or in combination with the visual notification. Furthermore, in flash memory devices comprising a display screen such as portable MP3 players (and the like), the visual notification can comprise of text and/or symbols.

Exemplary Process of Determining a Current Life Cycle Stage For A Flash Memory (Device)

Figure 6:
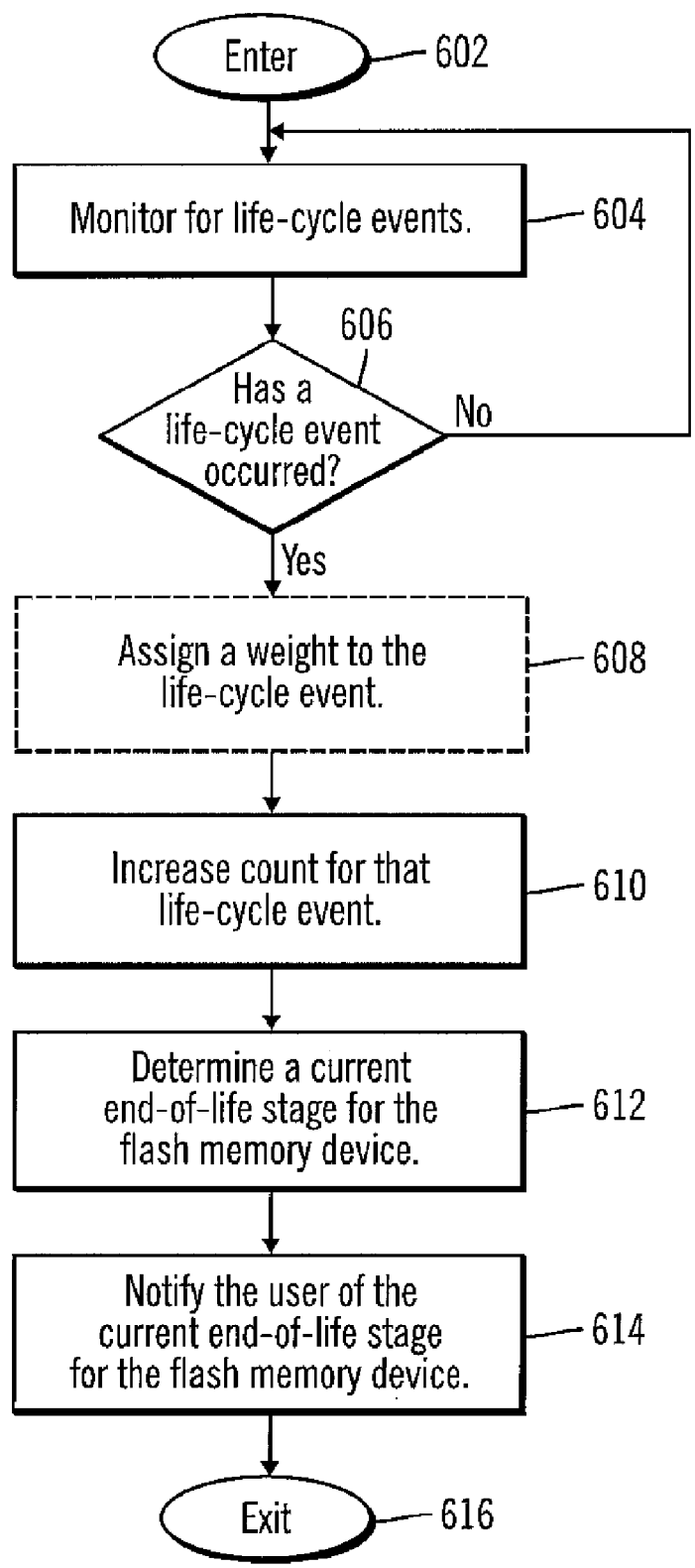
FIG. 6 is an operational flow diagram illustrating an exemplary process of determining a current life-cycle stage of a flash memory according to an embodiment of the present invention.

FIG. 6 shows an exemplary process of determining a current life cycle stage for a flash memory (device). The operational flow diagram of FIG. 6 begins at step 602 and flows directly to step 602. The following discussion is applicable to a flash memory device such as the device 100 in FIG. 1 or to an internal flash memory 208 as shown in FIG. 2. A counter 108, 220, at step 604, monitors a flash memory 104, 208 for life cycle events such as read/write cycles, power cycles, errors, and the like. The counter 108, 220, at step 606, determines if a life cycle event has occurred. If the result of this determination is negative, the control flows back to step 604 where the counter 108, 220 continues to monitor. If the result of this determination is positive, the counter 108, 220, at step 608, increases the current count for that particular life cycle event.

The counter 108, 200 or the end-of-life prediction module 112, 222, at step 610, optionally assigns a weight to the life cycle event. As discussed above, one life cycle event such as a write can weigh more heavily than another life cycle event such as a read. Based on the counted life cycle events, the end-of-life prediction module 112, 222, at step 612, determines a current life cycle stage for the flash memory 104, 208. The user, at step 614, is notified of the current life cycle event of the flash memory 104, 208. For example, a visual notification (as discussed with respect to FIGS. 3-5) or an audible notification can indicate to a user the current life cycle stage of the flash memory 104, 208. The control flow then exits at step 616.

It should be noted that the above process can be performed either directly on a flash memory device 100, an information processing system comprising flash memory 208, or by an information processing system communicatively coupled to an external flash memory device 100.

Non-Limiting Examples

The present invention can be realized in hardware, software, or a combination of hardware and software. A system according to a preferred embodiment of the present invention can be realized in a centralized fashion in one computer system or in a distributed fashion where different elements are spread across several interconnected computer systems. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein.

In general, the routines executed to implement the embodiments of the present invention, whether implemented as part of an operating system or a specific application, component, program, module, object or sequence of instructions may be referred to herein as a "program." The computer program typically is comprised of a multitude of instructions that will be translated by the native computer into a machine-readable format and hence executable instructions. Also, programs are comprised of variables and data structures that either reside locally to the program or are found in memory or on storage devices. In addition, various programs described herein may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A non-transitory computer readable medium for determining an end-of-life stage of the flash memory, the computer readable medium comprising instructions for:
    detecting at least one life cycle event associated with a flash memory residing on an electronic device;
    assigning one of a plurality of weights from a plurality of weights to the at least one life cycle event based on a life cycle event type associated with the at least one life cycle event, wherein each weight in the plurality of weights is associated with a different life cycle event type from a plurality of life cycle event types;

incrementing a counter associated with the at least one life cycle event based on the weight that has been assigned to the at least one life cycle event;

determining, based on the counter, a total number of occurrences for the at least one life cycle event;

storing the total number of occurrences for the at least one life cycle event on the flash memory;

determining if the total number of occurrences exceeds at least one given threshold;

identifying a current life cycle stage of the flash memory based at least in part on the determining if the total number of occurrences exceeds at least one given threshold, wherein the life cycle stage is associated with the at least one given threshold; and notifying a user of the life cycle state of the flash memory via at least one of a visual notification device and audible notification device directly coupled to the flash memory.

2. The non-transitory computer readable medium of claim 1, wherein the at least one life cycle event comprises at least one of:
   a write cycle to the flash memory;
   a read cycle from the flash memory;
   a power on cycle of the device comprising the flash memory; and
   an error existing in a memory cell of the flash memory.

3. The non-transitory computer readable medium of claim 1, wherein the identifying is based at least in part on the determining if the total number of occurrences exceeds at least one given threshold and the weight assigned to the at least one life cycle.

4. The non-transitory computer readable medium of claim 1, wherein the instructions for notifying further comprise instructions for at least one of:
   visually notifying the user; and
   audibly notifying the user.

5. The non-transitory computer readable medium of claim 1, wherein the current life cycle stage includes at least one of:
   a percentage of an estimated life time remaining for the flash memory;
   an estimated number of remaining life cycle events available for the flash memory; and
   an indication of the estimated life time remaining for the flash memory being one of:
      above average, average, and critical.

6. The non-transitory computer readable medium of claim 1, wherein the instructions for detecting are performed by the electronic device comprising the flash memory.

7. The non-transitory computer readable medium of claim 1, wherein the instructions for detecting are performed by another electronic device communicatively coupled to the electronic device comprising the flash memory.

8. The non-transitory computer readable medium of claim 4, wherein the instructions for visually notifying further comprise instructions for at least one of:
   illuminating, at least once, a set of visual indicating means on the device;
   displaying text on a display of the device; and
   graphically illustrating on an external display communicatively coupled to the device, a visual notification associated with the current life cycle stage.

9. A non-transitory computer readable medium on a first electronic device communicatively coupled to at least a second electronic device including at least one flash memory, for determining an end-of-life stage of the flash memory, the computer readable medium comprising instructions for:

detecting, by a first electronic device communicatively coupled to at least a second electronic device, at least one life cycle event associated with a flash memory residing on the at least second electronic device;

assigning one of a plurality of weights from a plurality of weights to the at least one life cycle event based on a life cycle event type associated with the at least one life cycle event, wherein each weight in the plurality of weights is associated with a different life cycle event type from a plurality of life cycle event types;

incrementing a counter associated with the life cycle event based on the weight that has been assigned to the at least one life cycle event;

determining, based on the counter, a total number of occurrences for the at least one life cycle event;

storing the total number of occurrences for the at least one life cycle event on the flash memory;

determining if the total number of occurrences exceeds at least one given threshold;

identifying a current life cycle stage of the flash memory based at least in part on the determining if the total number of occurrences exceeds at least one given threshold, wherein the life cycle stage is associated with the at least one given threshold; and notifying a user of the life cycle state of the flash memory.

10. The non-transitory computer readable medium of claim 9, wherein the at least one life cycle event is at least one of:
   a write cycle to the flash memory;
   a read cycle from the flash memory;
   a power on cycle of the second electronic device; and
   an error existing in a memory cell of the flash memory.

11. The non-transitory computer readable medium of claim 9, wherein the identifying is based at least in part on the determining if the total number of occurrences exceeds at least one given threshold and the weight assigned to the at least one life cycle.

12. The non-transitory computer readable medium of claim 9, wherein the instructions for notifying further comprise instructions for at least one of:
   visually notifying the user; and
   audibly notifying the user.

13. The non-transitory computer readable medium of claim 9, wherein the instructions for visually notifying further comprise instructions for at least one of:
   illuminating, at least once, a set of visual indicating means on the second electronic device;
   displaying text on a display of the second electronic device; and
   graphically illustrating on al display communicatively coupled to the first electronic device, a visual notification associated with the current life cycle stage.

14. The non-transitory computer readable medium of claim 9, wherein the current life cycle stage includes at least one of:
   a percentage of an estimated life time remaining for the flash memory;
   an estimated number of remaining life cycle events available for the flash memory; and
   an indication of the estimated life time remaining for the flash memory being one of:
      above average, average, and critical.

15. A non-transitory computer readable medium for determining an end-of-life stage of the flash memory, the computer readable medium comprising instructions for:
   detecting at least one life cycle event associated with a flash memory residing on an electronic device;
   assigning one of a plurality of weights from a plurality of weights to the at least one life cycle event based on a life cycle event type associated with the at least one life cycle event, wherein each weight in the plurality of weights is associated with a different life cycle event type from a plurality of life cycle event types;

incrementing a counter associated with the at least one life cycle event based on the weight that has been assigned to the at least one life cycle event;

determining, based on the counter, a total number of occurrences for the at least one life cycle event; and storing the total number of occurrences for the at least one life cycle event on the flash memory.

* * * * *